(12) United States Patent
Oh et al.

(10) Patent No.: US 7,451,369 B1
(45) Date of Patent: Nov. 11, 2008

(54) SCALABLE COLUMNAR BOUNDARY SCAN ARCHITECTURE FOR INTEGRATED CIRCUITS

(75) Inventors: Kwansuhk Oh, San Jose, CA (US); Raymond C. Pang, San Jose, CA (US)

(73) Assignee: Xilinx, Inc., San Jose, CA (US)

( * ) Notice: Subject to any disclaimer, the term of this patent is extended or adjusted under 35 U.S.C. 154(b) by 357 days.

(21) Appl. No.: 11/498,372

(22) Filed: Aug. 3, 2006

(51) Int. Cl.
G01R 31/28 (2006.01)
(52) U.S. Cl. .................... 714/727; 714/731
(58) Field of Classification Search ............... None
See application file for complete search history.

(56) References Cited

U.S. PATENT DOCUMENTS

| | | | | |
|---|---|---|---|---|
| 5,717,700 | A * | 2/1998 | Crouch et al. ............... | 714/726 |
| 7,327,161 | B2 * | 2/2008 | Jang et al. ................... | 326/46 |
| 7,345,507 | B1 * | 3/2008 | Young et al. ................. | 326/41 |
| 2004/0250185 | A1 * | 12/2004 | Date ............................ | 714/726 |

OTHER PUBLICATIONS

Xilinx, Inc.; "Virtex-4 Configuration Guide"; UG071 (v1.4); Jan. 24, 2006; available from Xilinx, Inc., 2100 Logic Drive, San Jose, California 95124; pp. 57-65.

* cited by examiner

*Primary Examiner*—Christine T Tu
(74) *Attorney, Agent, or Firm*—Lois D. Cartier

(57) ABSTRACT

An integrated circuit having a scalable boundary scan architecture. Logic elements, each including at least one data storage element, are arranged in rows and columns. A data distribution system couples the data storage elements together to form a boundary scan chain that traverses the columns in order, e.g., a first column, then a second column, and so forth, from top to bottom in each column. A clock distribution system is coupled to each of the data storage elements in the chain, and provides a clock signal to the first and second columns, again from top to bottom. The clock distribution system provides the clock signal to the top of the second column prior to providing it to the top of the first column. In some embodiments, an additional flip-flop is added to the boundary scan chain for each logic element, to increase the overall operating frequency of the scan chain.

19 Claims, 7 Drawing Sheets

SCALABLE COLUMNAR BOUNDARY SCAN ARCHITECTURE FOR INTEGRATED CIRCUITS

FIELD OF THE INVENTION

The invention relates to integrated circuit devices (ICs). More particularly, the invention relates to a scalable architecture for implementing boundary scan chains in ICs.

BACKGROUND OF THE INVENTION

Programmable logic devices (PLDs) are a well-known type of IC that can be programmed to perform specified logic functions. One type of PLD, the field programmable gate array (FPGA), typically includes an array of programmable tiles. These programmable tiles can include, for example, input/output blocks (IOBs), configurable logic blocks (CLBs), dedicated random access memory blocks (BRAM), multipliers, digital signal processing blocks (DSPs), processors, clock managers, delay lock loops (DLLs), and so forth.

Each programmable tile typically includes both programmable interconnect and programmable logic. The programmable interconnect typically includes a large number of interconnect lines of varying lengths interconnected by programmable interconnect points (PIPs). The programmable logic implements the logic of a user design using programmable elements that can include, for example, function generators, registers, arithmetic logic, and so forth.

The programmable interconnect and programmable logic are typically programmed by loading a stream of configuration data into internal configuration memory cells that define how the programmable elements are configured. The configuration data can be read from memory (e.g., from an external PROM) or written into the FPGA by an external device. The collective states of the individual memory cells then determine the function of the FPGA.

Another type of PLD is the Complex Programmable Logic Device, or CPLD. A CPLD includes two or more "function blocks" connected together and to input/output (I/O) resources by an interconnect switch matrix. Each function block of the CPLD includes a two-level AND/OR structure similar to those used in Programmable Logic Arrays (PLAs) and Programmable Array Logic (PAL) devices. In CPLDs, configuration data is typically stored on-chip in non-volatile memory. In some CPLDs, configuration data is stored on-chip in non-volatile memory, then downloaded to volatile memory as part of an initial configuration (programming) sequence.

For all of these programmable logic devices (PLDs), the functionality of the device is controlled by data bits provided to the device for that purpose. The data bits can be stored in volatile memory (e.g., static memory cells, as in FPGAs and some CPLDs), in non-volatile memory (e.g., FLASH memory, as in some CPLDs), or in any other type of memory cell.

Other PLDs are programmed by applying a processing layer, such as a metal layer, that programmably interconnects the various elements on the device. These PLDs are known as mask programmable devices. PLDs can also be implemented in other ways, e.g., using fuse or antifuse technology. The terms "PLD" and "programmable logic device" include but are not limited to these exemplary devices, as well as encompassing devices that are only partially programmable. For example, one type of PLD includes a combination of hard-coded transistor logic and a programmable switch fabric that programmably interconnects the hard-coded transistor logic.

PLDs are often provided in "product families" that include PLDs having the same or similar basic structures, but including different numbers of programmable tiles. PLDs are therefore "scalable" in nature, because a PLD having a larger logic capacity can be created, for example, by adding additional columns of programmable tiles to an existing smaller PLD. However, while the amount of programmable logic included in the PLD may be scalable, the various sub-circuits that support the programmable logic often are not. For example, the boundary scan chain in a PLD is typically not scalable, because the addition of more programmable logic changes the timing of the boundary scan circuitry. Hence, generating a new member of a PLD product family can require an undesirable amount of simulation and redesign to individualize the boundary scan logic to meet the timing requirements imposed by the applicable standard.

Therefore, it is desirable to provide a PLD boundary scan architecture that scales with the amount of programmable logic included in the PLD, without requiring extensive testing and redesign to accommodate the changes in the programmable logic.

SUMMARY OF THE INVENTION

The invention provides an integrated circuit (IC) having a scalable boundary scan architecture. Logic elements (e.g., programmable logic elements) are arranged in rows and columns. Each logic element includes one or more data storage elements (e.g., including one or more flip-flops) that are used for boundary scan purposes. A data distribution system couples the data storage elements together to form a boundary scan chain that traverses the columns in order, e.g., a first column, then a second column, and so forth, from top to bottom (or bottom to top) in each column. A clock distribution system is coupled to each of the data storage elements in the boundary scan chain, and provides a boundary scan clock signal to the first and second columns, again from top to bottom (or bottom to top). However, the order in which the clock signal is supplied to the data storage elements differs from the order of the data storage elements in the boundary scan chain. The clock distribution system provides the clock signal to the top (or bottom) of the second column prior to providing the clock signal to the top (or bottom) of the first column. In some embodiments, an additional flip-flop is added to the boundary scan chain for each logic element, e.g., between each pair of logic elements, to increase the overall operating frequency of the boundary scan chain.

This arrangement increases the overall speed of the boundary chain and makes it easier to guarantee the hold time of the data signal with respect to the clock signal for each data storage element, even when additional columns of logic elements are added to the integrated circuit. Therefore, extensive testing and redesign of the data and clock distribution systems is not necessary when additional columns of logic are added to the integrated circuit.

BRIEF DESCRIPTION OF THE DRAWINGS

The present invention is illustrated by way of example, and not by way of limitation, in the following figures.

DETAILED DESCRIPTION OF THE DRAWINGS

The present invention is applicable to a variety of integrated circuits (ICs). The present invention has been found to be particularly applicable and beneficial for programmable logic devices (PLDs). An appreciation of the present invention is presented by way of specific examples utilizing PLDs such as field programmable gate arrays (FPGAs). However, the present invention is not limited by these examples, and can be applied to other ICs, including ICs that are not programmable or are only partially programmable.

Figure 1:
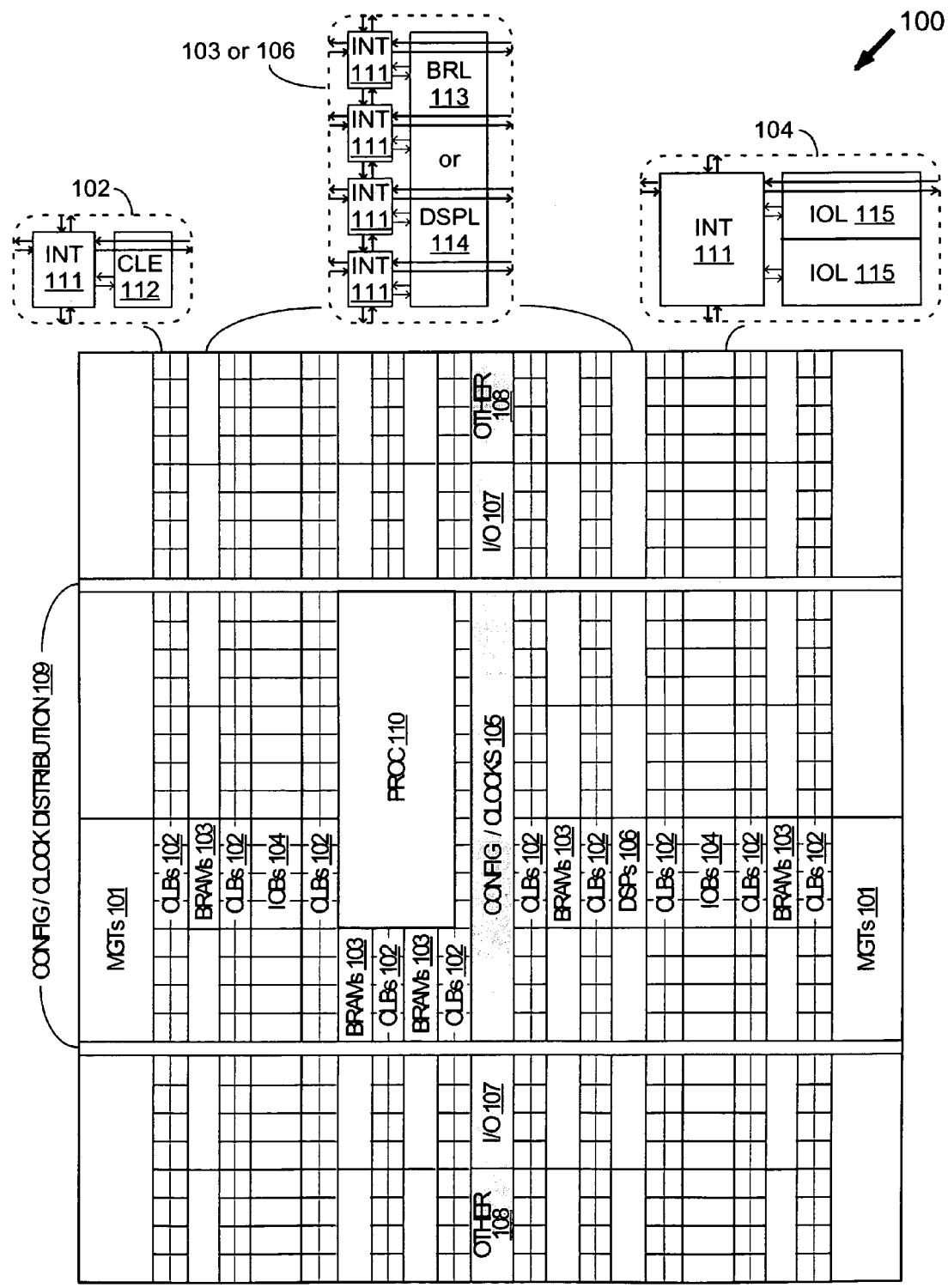
FIG. 1 is a block diagram of an exemplary field programmable gate array (FPGA).

FIG. 1 illustrates an FPGA architecture 100 that includes a large number of different programmable tiles including multi-gigabit transceivers (MGTs 101), configurable logic blocks (CLBs 102), random access memory blocks (BRAMs 103), input/output blocks (IOBs 104), configuration and clocking logic (CONFIG/CLOCKS 105), digital signal processing blocks (DSPs 106), specialized input/output blocks (I/O 107) (e.g., configuration ports and clock ports), and other programmable logic 108 such as digital clock managers, analog-to-digital converters, system monitoring logic, and so forth. Some FPGAs also include dedicated processor blocks (PROC 110).

In some FPGAs, each programmable tile includes a programmable interconnect element (INT 111) having standardized connections to and from a corresponding interconnect element in each adjacent tile. Therefore, the programmable interconnect elements taken together implement the programmable interconnect structure for the illustrated FPGA. The programmable interconnect element (INT 111) also includes the connections to and from the programmable logic element within the same tile, as shown by the examples included at the top of FIG. 1.

For example, a CLB 102 can include a configurable logic element (CLE 112) that can be programmed to implement user logic plus a single programmable interconnect element (INT 111). A BRAM 103 can include a BRAM logic element (BRL 113) in addition to one or more programmable interconnect elements. Typically, the number of interconnect elements included in a tile depends on the height of the tile. In the pictured embodiment, a BRAM tile has the same height as four CLBs, but other numbers (e.g., five) can also be used. A DSP tile 106 can include a DSP logic element (DSPL 114) in addition to an appropriate number of programmable interconnect elements. An IOB 104 can include, for example, two instances of an input/output logic element (IOL 115) in addition to one instance of the programmable interconnect element (INT 111). As will be clear to those of skill in the art, the actual I/O pads connected, for example, to the I/O logic element 115 are manufactured using metal layered above the various illustrated logic blocks, and typically are not confined to the area of the input/output logic element 115.

In the pictured embodiment, a columnar area near the center of the die (shown shaded in FIG. 1) is used for configuration, clock, and other control logic. Horizontal areas 109 extending from this column are used to distribute the clocks and configuration signals across the breadth of the FPGA.

Some FPGAs utilizing the architecture illustrated in FIG. 1 include additional logic blocks that disrupt the regular columnar structure making up a large part of the FPGA. The additional logic blocks can be programmable blocks and/or dedicated logic. For example, the processor block PROC 110 shown in FIG. 1 spans several columns of CLBs and BRAMs.

Note that FIG. 1 is intended to illustrate only an exemplary FPGA architecture. For example, the numbers of logic blocks in a column, the relative width of the columns, the number and order of columns, the types of logic blocks included in the columns, the relative sizes of the logic blocks, and the interconnect/logic implementations included at the top of FIG. 1 are purely exemplary. For example, in an actual FPGA more than one adjacent column of CLBs is typically included wherever the CLBs appear, to facilitate the efficient implementation of user logic, but the number of adjacent CLB columns varies with the overall size of the FPGA.

In common with many other ICs, PLDs typically include circuits that implement a boundary scan feature. Boundary scan is a technique by which the values at each input/output (I/O) pad are sampled by a boundary scan clock, and are stored in flip-flops included for that purpose. The flip-flops are coupled together in series to form a "boundary scan chain", through which the captured data can be shifted and then extracted for analysis or for other purposes. In some ICs, the boundary scan chain can also be used to input data (e.g., configuration data) into the IC.

Figure 2:
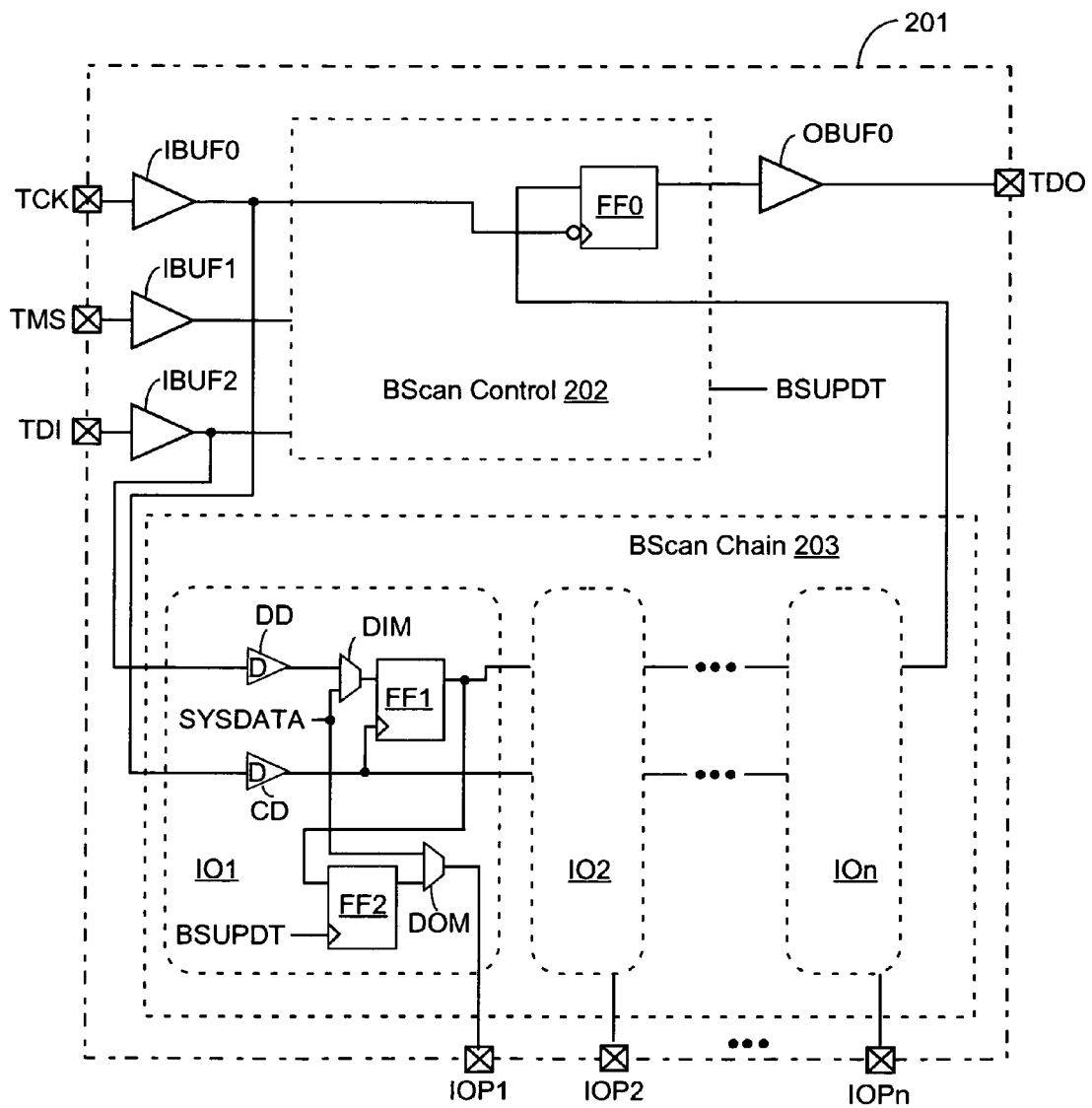
FIG. 2 illustrates the boundary scan circuitry in a typical integrated circuit.

FIG. 2 illustrates the boundary scan circuitry in a typical IC. IC 201 includes boundary scan control circuit 202 and boundary scan chain 203, as well as input buffers IBUF0-IBUF2 and output buffer OBUF0, coupled together as shown in FIG. 2. I/O pads IOP1-IOPn are the user input/output pads. TCK, TMS, TDI, and TDO are industry standard boundary scan signals that include the boundary scan clock signal (Test Clock), the mode select signal (Test Mode Select), and the input data signal (Test Data In), and to retrieve the output data signal (Test Data Out), respectively. For a description of boundary scan in a Virtex™-4 FPGA, for example, see pages 57-74 of the "Virtex-4 Configuration Guide, v1.4", available from Xilinx, Inc., at 2100 Logic Drive, San Jose, Calif. 95124, which is similar to a document originally published Aug. 2, 2004 and which pages are hereby incorporated herein by reference. (Xilinx, Inc., owner of the copyright, has no objection to copying these and other pages referenced herein but otherwise reserves all copyright rights whatsoever.)

Boundary scan control logic 202 includes a flip-flop FF0 that stores the outgoing boundary scan data from boundary scan chain 203. Flip-flop FF0 is clocked by the inverse of the boundary scan clock signal that drives boundary scan chain 203, as shown by the open circuit on the clock input terminal of flip-flop FF0. Boundary scan control logic is well known, and typically includes much more circuitry than is shown in FIG. 2, including circuitry for generating a boundary scan update signal BSUPDT.

Boundary scan chain 203 includes a series of logic elements, e.g., input/output logic blocks IO1-IOn. Each I/O block IO1-IOn includes flip-flops FF1, FF2 and multiplexers DIM, DOM, coupled together as shown in FIG. 2. In a normal operating mode, data input multiplexer DIM passes the system data signal SYSDATA (e.g., from the user design) to flip-flop FF1, placing the system data into the scan chain formed by a series of flip-flops FF1. A boundary scan update signal BSUPDT from boundary scan control logic 202 writes the data from flip-flop FF1 to a corresponding flip-flop FF2.

While in normal operating mode, data output multiplexer DOM passes the system data signal SYSDATA to the I/O pad IOPi.

In a test mode, data input multiplexer DIM passes the test data to flip-flop FF1. For the first logic element in the scan chain, the test data is Test Data In (TDI) signal. For successive logic elements in the scan chain, the test data is the test data output from the previous logic element in the scan chain. The output of the final flip-flop FF1 in the scan chain is passed to the boundary scan control circuit 202 and hence to the Test Data Out (TDO) pad for integrated circuit 201. Also while in test mode, data output multiplexer DOM passes the stored boundary scan data from each flip-flop FF2 to a corresponding I/O pad IOPi.

FIG. 2 also includes elements DD and CD that are included in the data and clock chains, respectively. Elements DD ("data delay") and CD ("clock delay") represent unavoidable delays (e.g., circuit and wire RC delays) that can occur in any circuit. These delays may be different from each other, and may have different values in different ones of logic elements IO1-IOn.

Figure 3:
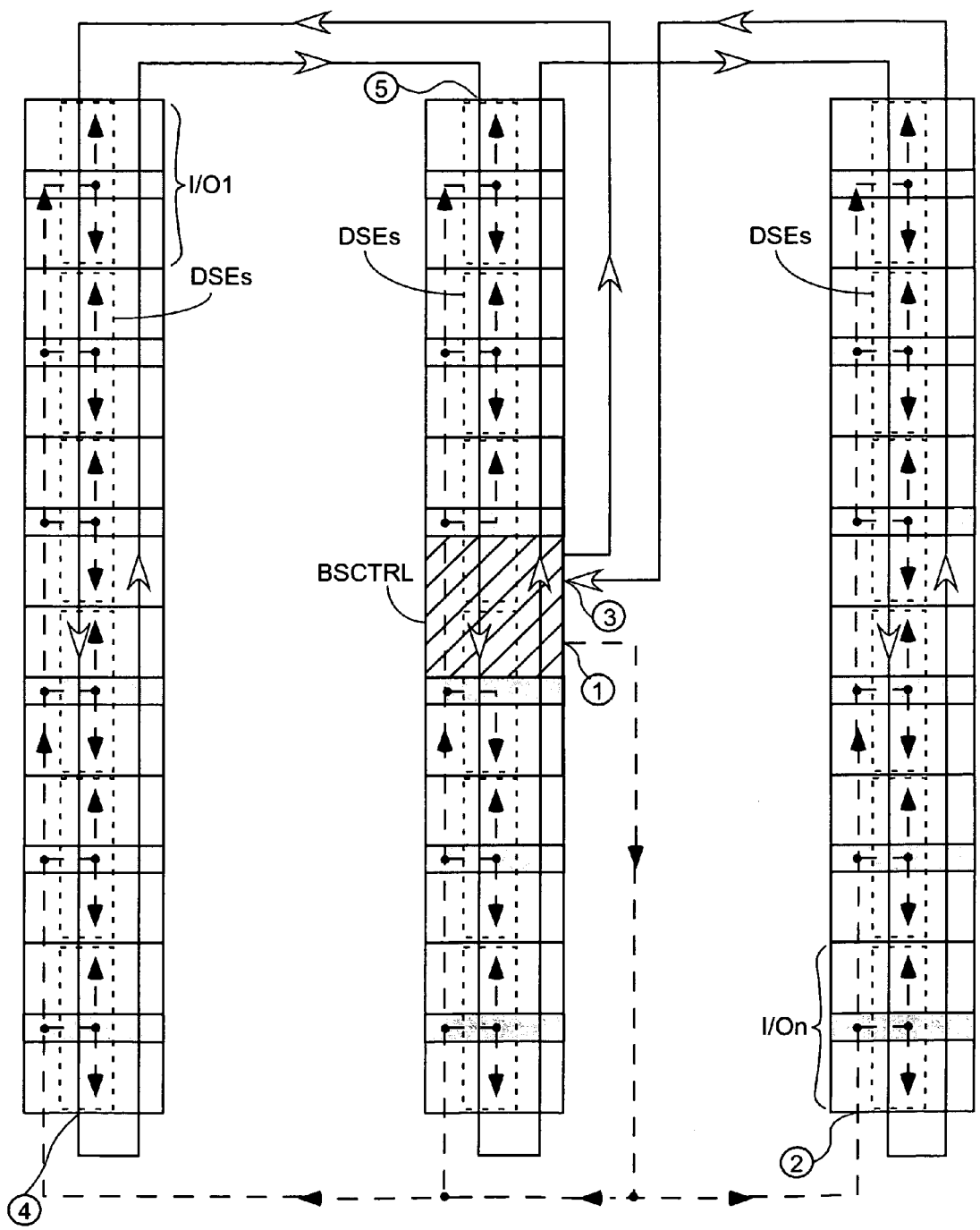
FIG. 3 illustrates how the data and clock signals are distributed to the logic elements of a known IC to implement a boundary scan chain.

FIG. 3 illustrates how the boundary scan logic of FIG. 2 is implemented in a known IC (e.g., in the FPGA illustrated in FIG. 1). In the IC of FIG. 3, the logic elements (which in this case include a number of programmable I/O blocks) are arranged in rows and columns, and the data and clock distribution systems must bridge the gaps between the different columns of logic elements. The data distribution system is shown using solid lines, with the open arrowheads denoting the direction of the data flow. The clock distribution system is shown using dashed lines, with the solid arrowheads denoting the direction in which the boundary scan clock signal is distributed. The rectangular areas enclosed by dotted lines (labeled DSEs) show the locations of the data storage elements making up the boundary scan chain. Thus, these rectangular areas can include, for example, flip-flops and multiplexers as shown in the exemplary logic element IO1 of FIG. 2. The boundary scan control logic is implemented in the area filled with a diagonal hatch pattern and labeled "BSCTRL". This area typically includes other logic in addition to the boundary scan control logic, and may include, for example, the TCK, TMS, TDI, and TDO pads and I/O logic.

The Test Data Input signal (TDI) is received at the TDI input port and provided to the boundary scan control logic (BSCTRL), from which it is routed to the top of the first (leftmost) column of logic elements. The label I/O1 designates the first logic element in the boundary scan chain. The boundary scan chain traverses the first column from top to bottom, and is then routed to the second column, which in the pictured IC also includes the boundary scan I/O ports and control logic. The second column is also traversed in order from top to bottom, followed by the third (rightmost) column. The captured data from the last logic element of the third column (logic element I/On) is routed back to the boundary scan control logic BSCTRL, and hence to the Test Data Out (TDO) output port. The boundary scan clock signal is routed to the bottom of the IC, then out to both sides and up the columns to drive each boundary scan flip-flop in the three columns.

It will be understood that the terms "top", "bottom", "left", and "right" as used herein are relative to one another and to the conventions followed in the figures and specification, and are not indicative of any particular orientation of or on the physical die. It will also be understood that the terms "column" and "row" are used to designate direction with respect to the figures herein, and that a "column" in one embodiment can be a "row" in another embodiment.

Figure 4:
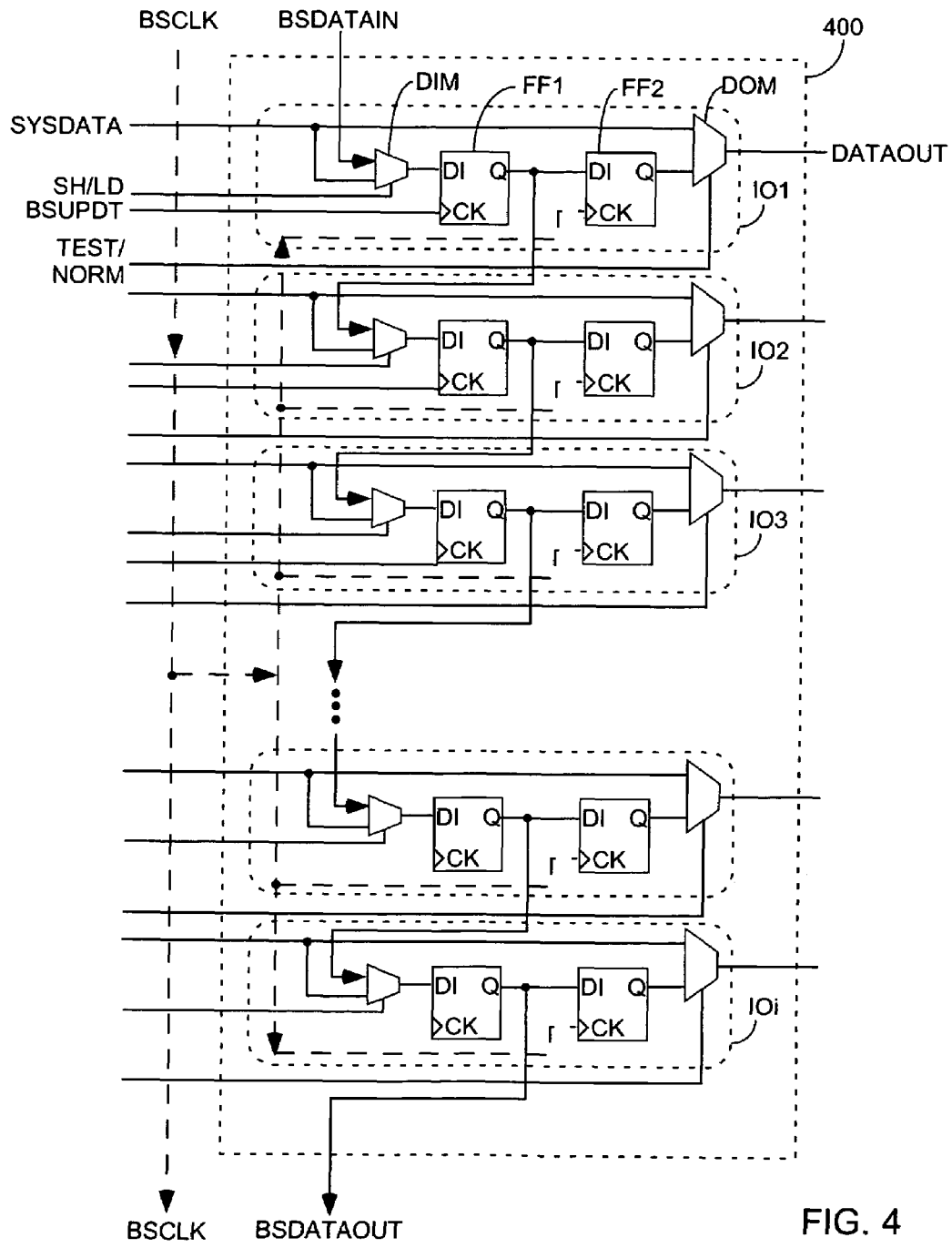
FIG. 4 illustrates in more detail the boundary scan chain in one logic element in the IC of FIG. 3.

A "logic element" can correspond to a programmable tile (see FIG. 1), an input/output block (IOB) or input/output logic element (IOL), a series of programmable tiles or IOBs, or some other grouping of logic circuitry, which may or may not be programmable, and may or may not include input/output logic. Note that a logic element may include not just one data storage element, but many data storage elements, as shown in FIG. 4, in which the boundary scan chain portion 400 of one logic element includes many data storage elements IO1-IOi. The boundary scan chain traverses each of the flip-flops in the data storage elements that are used to capture data for this purpose, as shown, from the data in signal BSDATAIN to the data out signal BSDATAOUT. Other flip-flops included in the logic element may not be included in the boundary scan chain, because they are intended for other purposes. In some embodiments, logic elements include fewer or greater numbers of boundary scan flip-flops. Note that in the pictured logic element, the boundary scan clock signal BSCLK is provided to the boundary scan flip-flops at a central point, and is then distributed upwards and downwards to the various flip-flops. In some embodiments, the clock is distributed within the logic element using some other scheme.

Returning now to FIG. 2, timing difficulties can arise in the circuitry of FIG. 2 when the circuit and wire RC delays DD, CD in the boundary scan chain 203 vary from each other. For example, the data delay DD in the data path chain between two adjacent flip-flops in a single column is relatively unvarying. However, the data delay DD between two flip-flops that are in two different columns (e.g., the delay from the data element at the bottom of the first column (point 4) and the data element at the top of the second column (point 5) in FIG. 3) is clearly quite different from the delay between two adjacent flip-flops in the same column, even though both flip-flop pairs are logically adjacent in the boundary scan chain. Similar variations in delay can occur in the clock distribution system. To conform to industry standards, the boundary scan chain must operate at an industry specified maximum frequency. Because of the variation in delays at different points on the data and clock paths, the maximum frequency at which the scan chain can operate may be limited by just a few path delays in the circuit.

For example, one path limiting the operating frequency may be the delay from the clock signal at point 1 to the last flip-flop in the boundary scan chain (point 2), with the data then returning to the boundary scan control logic at point 3. The boundary scan control logic includes a flip-flop (not shown in FIG. 3) to register the returning data at point 3.

Additionally, data arriving at the flip-flops in the boundary scan chain must meet certain hold time requirements in order for the circuit to function reliably. For example, the flip-flop at point 5 must register data before the data changes in response to clocking of the flip-flop at point 4. Satisfying this hold time requirement requires carefully maintaining the necessary timing relationships between the clock delay from point 1 to point 4, the clock delay from point 1 to point 5, and the data delay between point 4 and point 5.

Looking at FIG. 3, it is clear that when the known data and clock distribution scheme is used, the clock and data path delays vary according to the numbers of rows and columns in the array, and the ratio between the numbers of rows and columns. Therefore, timing requirements (e.g., maximum frequency and minimum hold time requirements) are difficult to satisfy as the array changes size, e.g., between different family members containing different numbers of columns and rows. As a consequence, generating a family of variouslysized ICs requires that design and verification of the boundary scan circuitry be performed individually for each family member.

Figure 5:
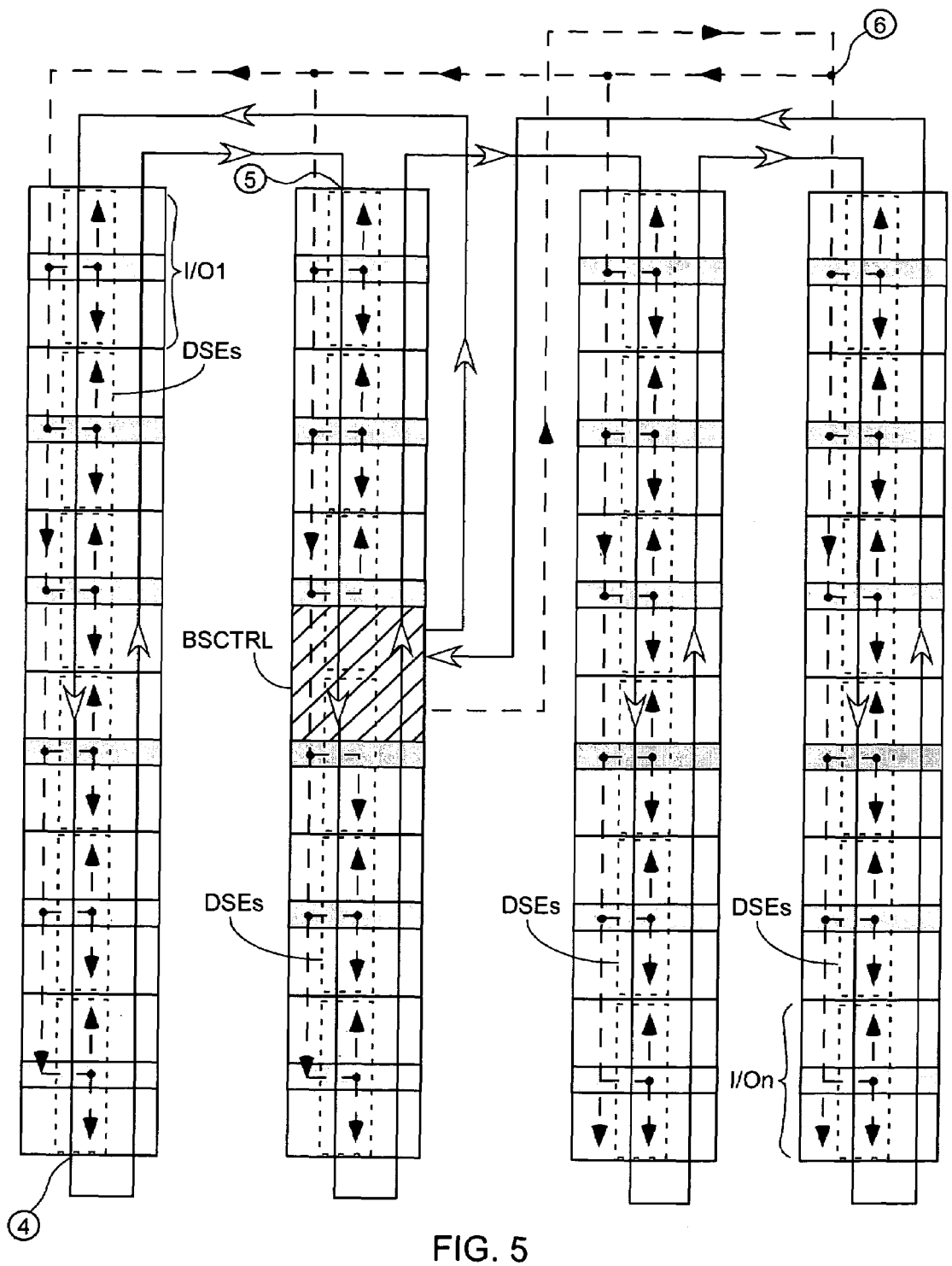
FIG. 5 illustrates how the data and clock signals are distributed to the logic elements in a first novel IC to implement a boundary scan chain.

FIG. 5 illustrates an IC in which the boundary scan circuitry is scalable, such that various family members (e.g., with different numbers of columns and/or rows) can be generated without redesigning and retesting the boundary scan clock and data distribution systems. As in the IC of FIG. 3, the logic elements are arranged in rows and columns, and the data and clock distribution systems must bridge the gaps between the different columns of logic elements. As in the IC of FIG. 3, a "logic element" can correspond to a programmable tile (see FIG. 1), an input/output block (IOB) or input/output logic element (IOL), a series of programmable tiles or IOBs, or some other grouping of logic circuitry, which may or may not be programmable, and may or may not include input/output logic. Note that a logic element may include not just one flip-flop, but many flip-flops, as shown in FIG. 4.

In FIG. 5, as in FIG. 3, the data distribution system is shown using solid lines, with the open arrowheads denoting the direction of the data flow. The clock distribution system is shown using dashed lines, with the solid arrowheads denoting the direction in which the boundary scan clock signal is distributed. The rectangular areas enclosed by dotted lines (FFs) show the locations of the data storage elements (e.g., flip-flops) making up the boundary scan chain.

However, the clock and data distribution systems in the IC of FIG. 5 are different from those of the IC shown in FIG. 3. For example, the clock signal originating from the boundary scan control logic (BSCTRL) is first routed to the top of the rightmost column of logic elements (point 6). From that point, the clock signal is routed towards the left side of the IC, e.g., in a row of tiles that extend along the top edge of the array. This right to left route is then tapped to generate clock signals to be sent down the various columns of logic elements, providing a clock signal to the flip-flops of the boundary scan chain. This clock distribution guarantees hold time requirements by design, because flip-flops further "downstream" in the scan chain are clocked before flip-flops that occur earlier in the scan chain. For example, the flip-flop at point 5 is clocked before the flip-flop at point 4. Therefore, when this clock distribution scheme is used, hold time is satisfied regardless of the number of columns in the array. Thus, the boundary scan circuitry is easily scalable (e.g., a fourth column can be added as shown in FIG. 5) without needing to reverify timing for every IC family member with a differently sized array.

Figure 6:
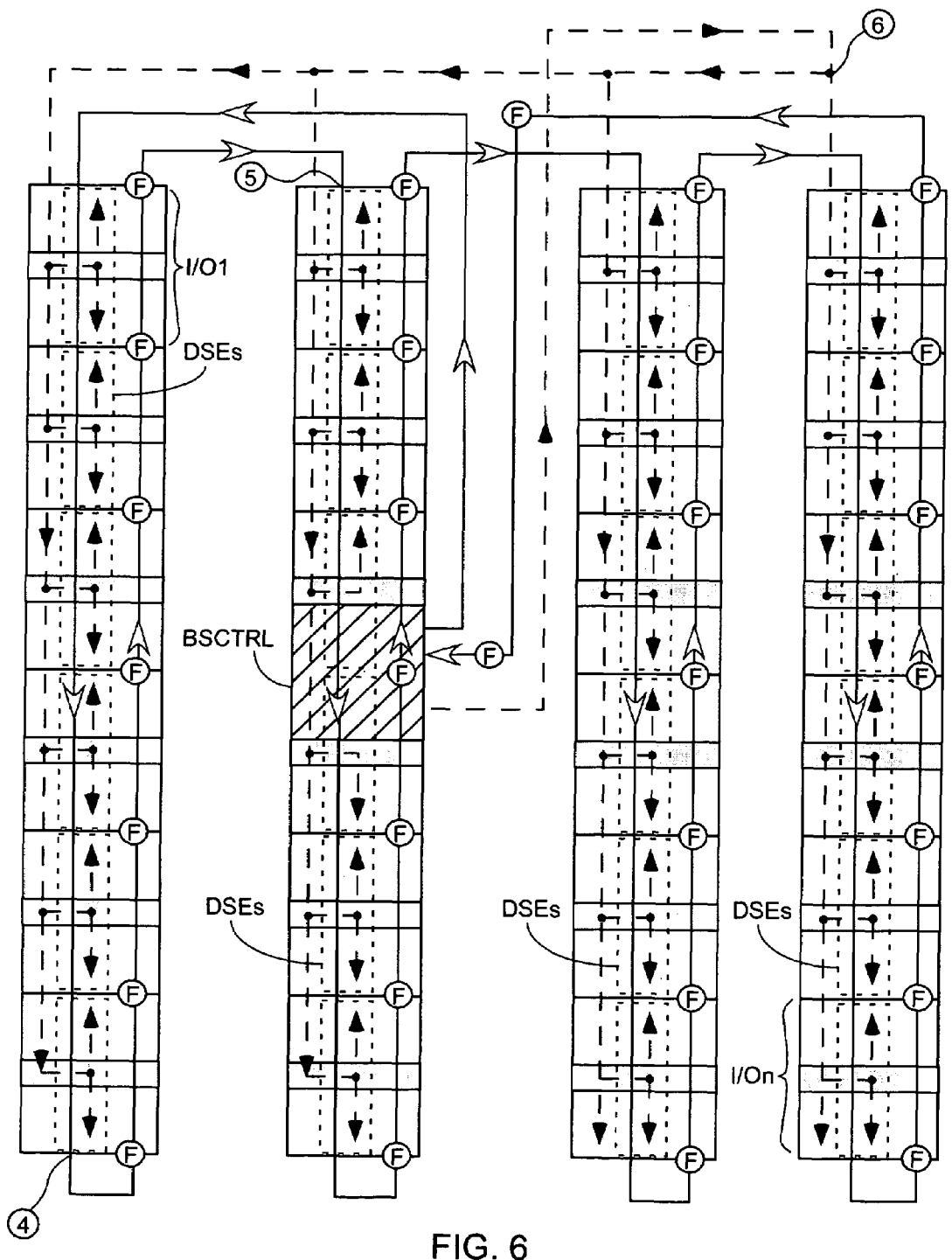
FIG. 6 illustrates how the data and clock signals are distributed to the logic elements in a second novel IC to implement a boundary scan chain.
Figure 7:
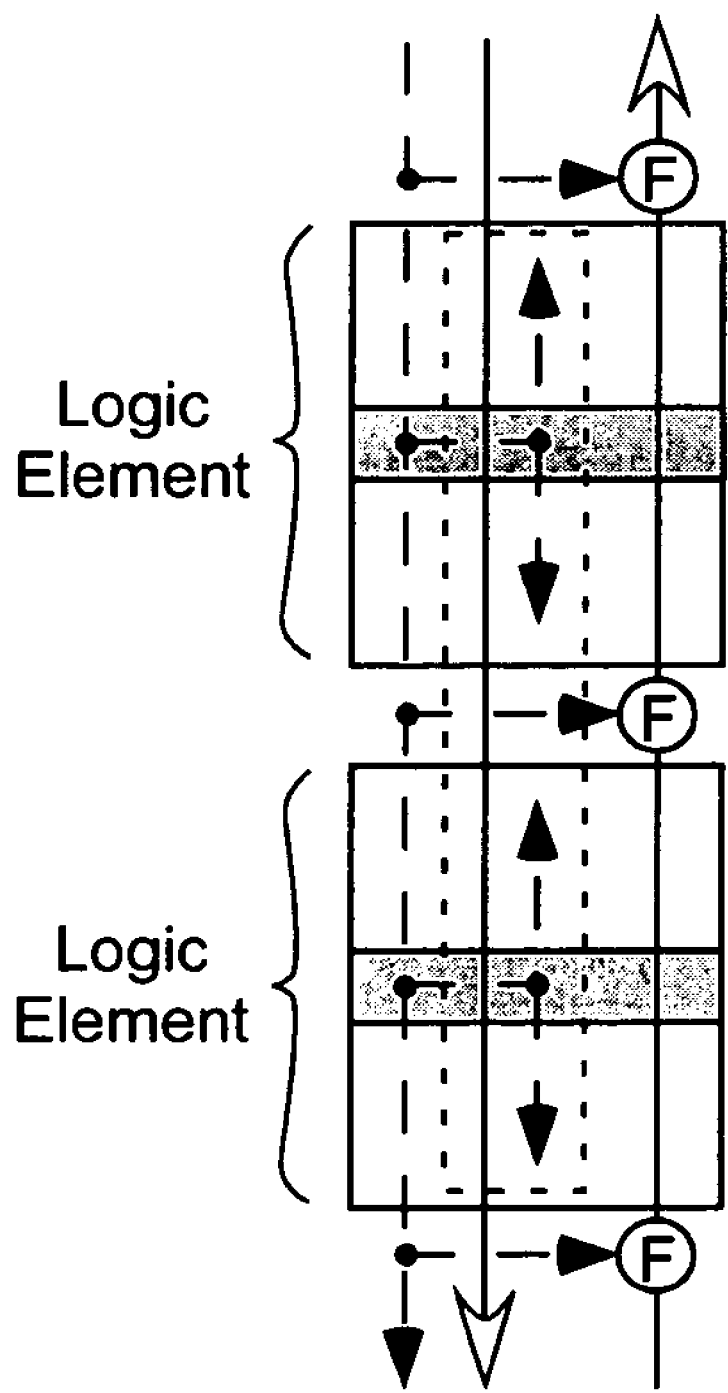
FIG. 7 illustrates how the boundary scan clock signal can be distributed to extra flip-flops inserted in the scan chain, as in the embodiment of FIG. 6.

FIG. 6 illustrates another improvement that can be made that increases the operating frequency of the boundary scan chain. The IC of FIG. 6 is similar to that of FIG. 5, except that additional flip-flops are inserted into the boundary scan chain at the points labeled "F". (In some embodiments, a simple flip-flop is inserted at each point labeled F. In other embodiments, a simple flip-flop is inserted at only some of these points. In yet other embodiments, a more complicated data storage element is included at some or all of these points.) Without these added flip-flops (e.g., as in the embodiment of FIG. 5) the data return paths place a limit on the maximum operating frequency of the boundary scan chain. For example, the delay from point 4 to point 5 in FIG. 5 includes a long path delay between two flip-flops that are logically adjacent, but not physically adjacent, to one another in the boundary scan chain. Without the added flip-flops, this long path delay can cause a setup violation in the destination flip-flop (at point 5) for the path. The added flip-flops can be clocked, for example, from the points between the logic elements, as indicated in FIG. 7.

In some embodiments, additional flip-flops are added to the boundary scan chain between the columns, e.g., along the data paths (solid lines) at the top of FIG. 6. This approach is particularly useful for large ICs in which the I/O columns are widely separated. In some embodiments, delay elements (e.g., buffers, not shown) are added to the clock paths along the columns to ensure that the clock does not "overrun" the data and cause hold time violations. It will be apparent to one skilled in the art after reading this specification that the present invention can be practiced within these and other architectural variations.

Those having skill in the relevant arts of the invention will now perceive various modifications and additions that can be made as a result of the disclosure herein. For example, logic elements, data storage elements, flip-flops, delay elements, buffers, and other components other than those described herein can be used to implement the invention. Moreover, some components are shown directly connected to one another while others are shown connected via intermediate components. In each instance the method of interconnection establishes some desired electrical communication between two or more circuit nodes. Such communication can often be accomplished using a number of circuit configurations, as will be understood by those of skill in the art.

Accordingly, all such modifications and additions are deemed to be within the scope of the invention, which is to be limited only by the appended claims and their equivalents.

What is claimed is:

1. An integrated circuit (IC), comprising:
   a plurality of logic elements arranged in rows and columns, each of the logic elements comprising at least one data storage element;
   a data distribution system coupling the data storage elements together in series to form a boundary scan chain, wherein the boundary scan chain traverses in order a first data storage element through a last data storage element in a first column, followed in order by a first data storage element through a last data storage element in a second column; and
   a clock distribution system coupled to each of the data storage elements in the boundary scan chain, wherein the clock distribution system is coupled to provide a boundary scan clock signal to the first data storage element in the second column prior to providing the boundary scan clock signal to the first data storage element in the first column, and wherein, for each column, the clock distribution system is further coupled to provide the boundary scan clock signal to the first data storage element in the column prior to providing the boundary scan clock signal to the last data storage element in the column.

2. The IC of claim 1, further comprising:
   a plurality of flip-flops, a corresponding one of the flip-flops being coupled between each logically adjacent pair of logic elements in the boundary scan chain.

3. The IC of claim 1, wherein:
   the boundary scan chain traverses a third column after traversing the second column, traversing in order a first data storage element through a last data storage element in the third column; and
   the clock distribution system is further coupled to provide the boundary scan clock signal to the third column prior to providing the boundary scan clock signal to the second column.

4. The IC of claim 1, wherein the IC comprises a programmable integrated circuit, and wherein the logic elements comprise programmable logic elements.

5. The IC of claim 1, wherein the second column comprises a boundary scan control circuit coupled to the data distribution system and the clock distribution system.

6. The IC of claim 1, wherein the logic elements comprise input/output logic elements providing external access to internal points within the IC.

7. An integrated circuit (IC), comprising:
   a first column of logic elements, each of the logic elements comprising at least one data storage element, each of the data storage elements in the first column except for a last data storage element in the first column comprising a data output terminal coupled to a data input terminal of a subsequent data storage element in the first column;
   a second column of logic elements, each of the logic elements comprising at least one data storage element, each of the data storage elements in the second column except for a last data storage element in the second column comprising a data output terminal coupled to a data input terminal of a subsequent data storage element in the second column; and
   a boundary scan control circuit,
   wherein:
      an output terminal of the boundary scan control circuit is coupled to the data input terminal of a first data storage element in the first column,
      the data output terminal of the last data storage element in the first column is coupled to a data input terminal of a first data storage element in the second column, and
      the data output terminal of the last data storage element in the second column is coupled to an input terminal of the boundary scan control circuit;
   and wherein:
      a clock output terminal of the boundary scan control circuit is coupled to each of the data storage elements in the first and second columns, wherein a boundary scan clock signal is provided to the first data storage element in the second column prior to providing the boundary scan clock signal to the first data storage element in the first column, and wherein, for each column, the boundary scan clock signal is provided to the first data storage element in the column prior to providing the boundary scan clock signal to the last data storage element in the column.

8. The IC of claim 7, further comprising:
   a plurality of flip-flops, each of the flip-flops being coupled between the data output terminal of one of the data storage elements and the data input terminal of another of the data storage elements.

9. The IC of claim 7, wherein the IC further comprises a third column of logic elements, and wherein:
   the third column is coupled between the data output terminal of the last data element in the second column and the data input terminal of the boundary scan control circuit; and
   the boundary scan clock signal is provided to the first data storage element in the third column prior to providing the boundary scan clock signal to the first data storage element in the second column.

10. The IC of claim 7, wherein the IC comprises a programmable integrated circuit, and wherein the logic elements comprise programmable logic elements.

11. The IC of claim 7, wherein the boundary scan control circuit is physically positioned within the second column.

12. The IC of claim 7, wherein the logic elements comprise input/output logic elements providing external access to internal points within the IC.

13. A method of implementing boundary scan in an integrated circuit (IC) comprising rows and columns of logic elements, each of the logic elements including at least one data storage element, the method comprising:
   coupling together data output and data input terminals of the data storage elements to form a boundary scan chain traversing, in order, a first data storage element through a last data storage element in a first column, followed in order by a first data storage element through a last data storage element in a second column; and
   providing a boundary scan clock signal to a clock input terminal of each data storage element in the boundary scan chain, comprising providing the boundary scan clock signal to the first data storage element in the second column prior to providing the boundary scan clock signal to the first data storage element in the first column, and further providing, for each column, the boundary scan clock signal to the first data storage element in the column prior to providing the boundary scan clock signal to the last data storage element in the column.

14. The method of claim 13, further comprising:
   inserting a flip-flop in the boundary scan chain between each logically adjacent pair of the data storage elements.

15. The method of claim 13, wherein:
   the boundary scan chain further comprises, in order after the last data storage element in the second column, a first data storage element through a last data storage element in a third column; and
   providing the boundary scan clock signal to the clock input terminal of each data storage element in the boundary scan chain further comprises providing the boundary scan clock signal to the first data storage element in the third column prior to providing the boundary scan clock signal to the first data storage element in the second column.

16. The method of claim 13, further comprising:
   inserting an additional column of the logic elements in the IC;
   adding to the boundary scan chain, in order after the last data storage element in the second column, a first data storage element through a last data storage element in the additional column; and
   providing the boundary scan clock signal to the first data storage element in the additional column prior to providing the boundary scan clock signal to the first data storage element in the second column.

17. The method of claim 13, wherein the IC comprises a programmable integrated circuit, and wherein the logic elements comprise programmable logic elements.

18. The method of claim 13, further comprising:
   inserting boundary scan control logic in the second column.

19. The method of claim 13, wherein the logic elements comprise input/output logic elements providing external access to internal points within the IC.

* * * * *